(12) United States Patent
Lin et al.

(10) Patent No.: US 10,651,794 B1
(45) Date of Patent: May 12, 2020

(54) DOWN-CONVERSION MIXER (71) Applicant: NATIONAL CHI NAN UNIVERSITY, Nantou (TW)

(72) Inventors: Yo-Sheng Lin, Nantou (TW); Kai-Siang Lan, Nantou (TW)

(73) Assignee: NATIONAL CHI NAN UNIVERSITY, Nantou (TW)

( * ) Notice: Subject to any disclaimer, the term of this patent is extended or adjusted under 35 U.S.C. 154(b) by 0 days.

(21) Appl. No.: 16/583,685

(22) Filed: Sep. 26, 2019

(30) Foreign Application Priority Data

Jul. 4, 2019 (TW) .............................. 108123661 A (51) Int. Cl.
*H03D 7/12* (2006.01)
*H03F 3/45* (2006.01)

(52) U.S. Cl.
CPC ......... *H03D 7/125* (2013.01); *H03F 3/45475* (2013.01)

(58) Field of Classification Search
CPC .... H03D 7/125; H03D 7/1433; H03D 7/1441; H03D 7/1443; H03D 7/1408; H03B 1/28; H03B 5/24; H03K 5/1252; H03F 3/45475
See application file for complete search history.

(56) References Cited

U.S. PATENT DOCUMENTS 8,829,974 B2 * 9/2014 Tsai ..................... H03D 7/1441
327/355
10,110,167 B2 * 10/2018 Lin ...................... H03D 7/1441

* cited by examiner

*Primary Examiner* — Long Nguyen
(74) *Attorney, Agent, or Firm* — Womble Bond Dickinson (US) LLP (57) ABSTRACT

A down-conversion mixer includes a converting-and-mixing module and a load module. The converting-and-mixing module performs voltage-to-current conversion and mixing with first and second differential oscillatory voltage signal pairs upon a differential input voltage signal pair to generate first and second differential mixed current signal pairs. The load module includes two RL circuits and a negative resistance providing circuit that cooperate to convert the first and second differential mixed current signal pairs into first and second differential mixed voltage signal pairs. Each RL circuit includes two variable resistors, and an inductor connected between the variable resistors.

11 Claims, 4 Drawing Sheets

DOWN-CONVERSION MIXER

CROSS-REFERENCE TO RELATED APPLICATION

This application claims priority of Taiwanese Patent Application No. 108123661, filed on Jul. 4, 2019.

FIELD

The disclosure relates to a mixer, and more particularly to a down-conversion mixer with a variable conversion gain.

BACKGROUND

Figure 1:
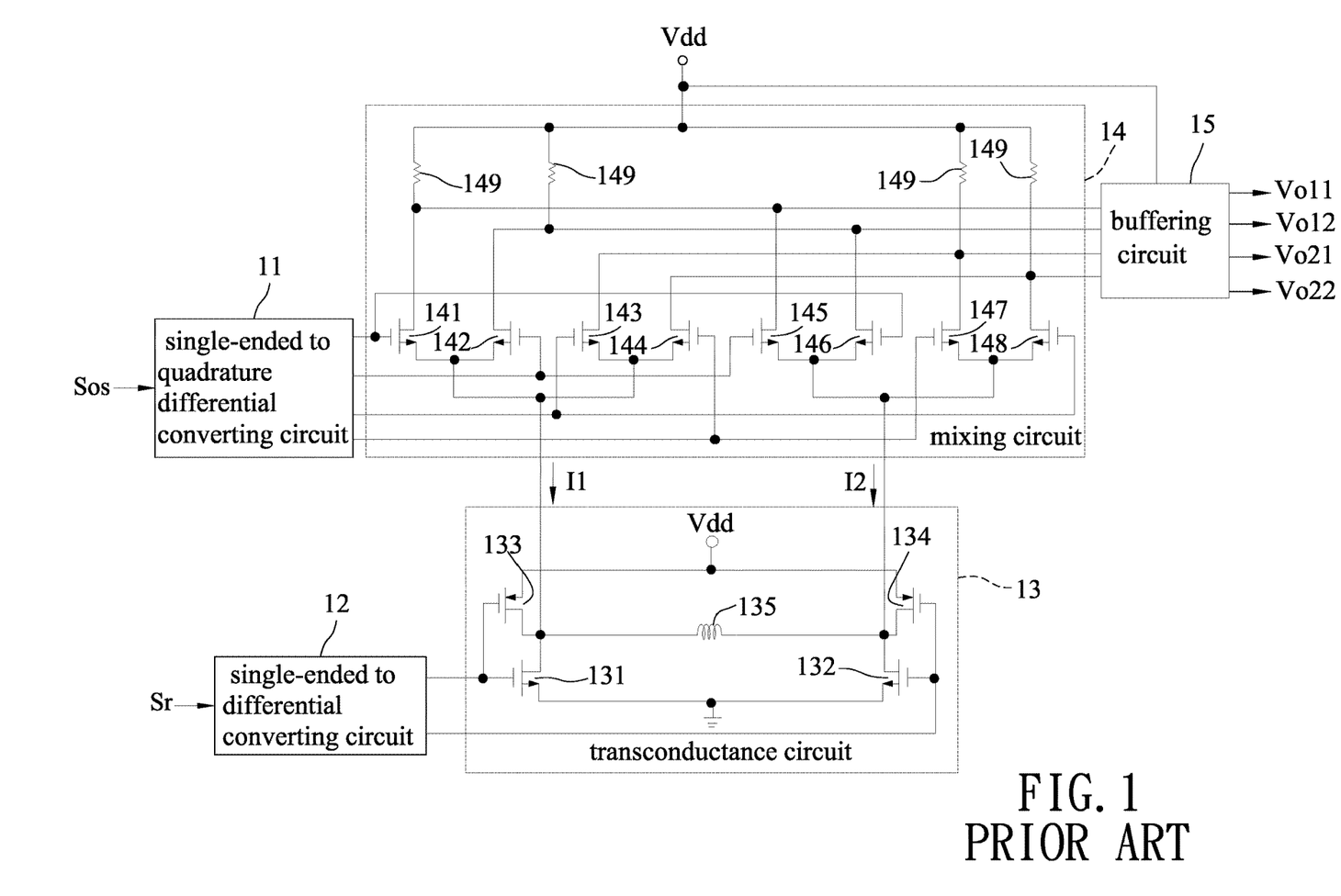
FIG. 1 is a circuit block diagram illustrating a conventional down-conversion mixer.

Referring to FIG. 1, a conventional down-conversion mixer includes a single-ended to quadrature differential converting circuit 11, a single-ended to differential converting circuit 12, a transconductance circuit 13, a mixing circuit 14 and a buffering circuit 15.

The single-ended to quadrature differential converting circuit 11 converts a single-ended oscillatory voltage signal (Sos) into a first differential oscillatory voltage signal pair and a second differential oscillatory voltage signal pair. The single-ended to differential converting circuit 12 converts a single-ended input voltage signal (Sr) of radio frequency into a differential input voltage signal pair. The transconductance circuit 13 includes four transistors 131-134 and an inductor 135, and converts the differential input voltage signal pair into a differential input current signal pair (I1, I2). The mixing circuit 14 includes eight transistors 141-148 and four resistors 149, and mixes the differential input current signal pair (I1, I2) with the first and second differential oscillatory voltage signal pairs to generate a first differential mixed voltage signal pair and a second differential mixed voltage signal pair that are of intermediate frequency. The buffering circuit 15 buffers the first and second differential mixed voltage signal pairs to generate a first differential output voltage signal pair (Vo11, Vo12) and a second differential output voltage signal pair (Vo21, Vo22).

When a frequency of each of the first and second differential mixed voltage signal pairs is low, a conversion gain (CG) of a combination of the transconductance circuit 13 and the mixing circuit 14 can be expressed by the following equation:

$$CG \approx \frac{2}{\Pi} \cdot \mathrm{sinc}(\Pi \cdot \Delta / T_{OS}) \cdot (g_{m131,132} + g_{m133,134}) \cdot R_L, \quad \text{Equation 1}$$

where $g_{m131,132}$ denotes a transconductance of each of the transistors 131, 132, $g_{m133,134}$ denotes a transconductance of each of the transistors 133, 134, $R_L$ denotes a resistance of each of the resistors 149, $T_{OS}$ denotes a period of each of the first and second differential oscillatory voltage signal pairs, and Δ denotes a half of the fraction of the period in which all of the transistors 141-148 conduct.

Since all of the parameters in Equation 1 are fixed, both the CG of the combination of the transconductance circuit 13 and the mixing circuit 14 and a CG of the conventional down-conversion mixer are fixed. In addition, the CG of the conventional down-conversion mixer is low, and a noise figure of the conventional down-conversion mixer is high.

SUMMARY

Therefore, an object of the disclosure is to provide a down-conversion mixer with a variable conversion gain.

According to the disclosure, the down-conversion mixer includes a converting-and-mixing module and a load module. The converting-and-mixing module is for receiving a differential input voltage signal pair, a first differential oscillatory voltage signal pair and a second differential oscillatory voltage signal pair, and performs voltage-to-current conversion and mixing with the first and second differential oscillatory voltage signal pairs upon the differential input voltage signal pair to generate a first differential mixed current signal pair and a second differential mixed current signal pair. The load module has a first terminal and a second terminal that are connected to the converting-and-mixing module for cooperatively receiving the first differential mixed current signal pair therefrom, and a third terminal and a fourth terminal that are connected to the converting-and-mixing module for cooperatively receiving the second differential mixed current signal pair therefrom. The load module converts the first differential mixed current signal pair into a first differential mixed voltage signal pair that is provided at the first and second terminals thereof, and converts the second differential mixed current signal pair into a second differential mixed voltage signal pair that is provided at the third and fourth terminals thereof. The load module includes a negative resistance providing circuit and two resistor-inductor (RL) circuits. The negative resistance providing circuit is connected to the first to fourth terminals of the load module, and provides two negative resistances, one of which is between the first and second terminals of the load module, and the other one of which is between the third and fourth terminals of the load module. One of the RL circuits is connected between the first and second terminals of the load module. The other one of the RL circuits is connected between the third and fourth terminals of the load module. Each of the RL circuits includes two variable resistors and an inductor that are connected in series between a corresponding one of the first and third terminals of the load module and a corresponding one of the second and fourth terminals of the load module, with the inductor connected between the variable resistors.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Before the disclosure is described in greater detail, it should be noted that throughout the disclosure, each current signal may have a positive magnitude or a negative magnitude, with the positive and negative magnitudes indicating opposite directions of the current signal. For example, when a component receives a current signal with the positive magnitude, the current signal flows into the component; and when the component receives the current signal with the negative magnitude, the current signal flows out of the component. Moreover, it should be noted that throughout the drawings, the direction of each current signal is shown by a corresponding arrow.

Figure 2:
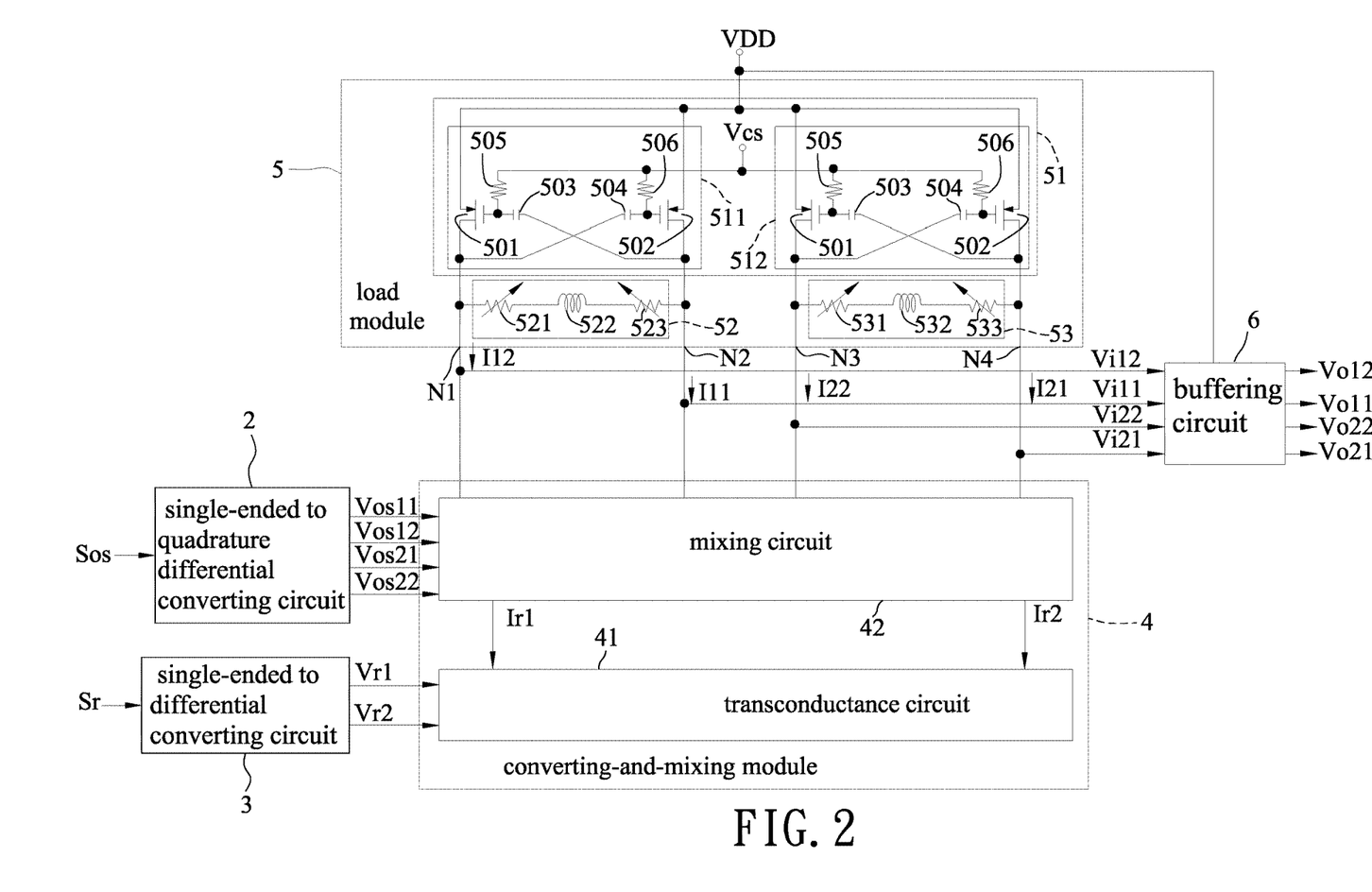
FIGS. 2 and 3 are circuit block diagrams illustrating an embodiment of a down-conversion mixer according to the disclosure.
Figure 3:
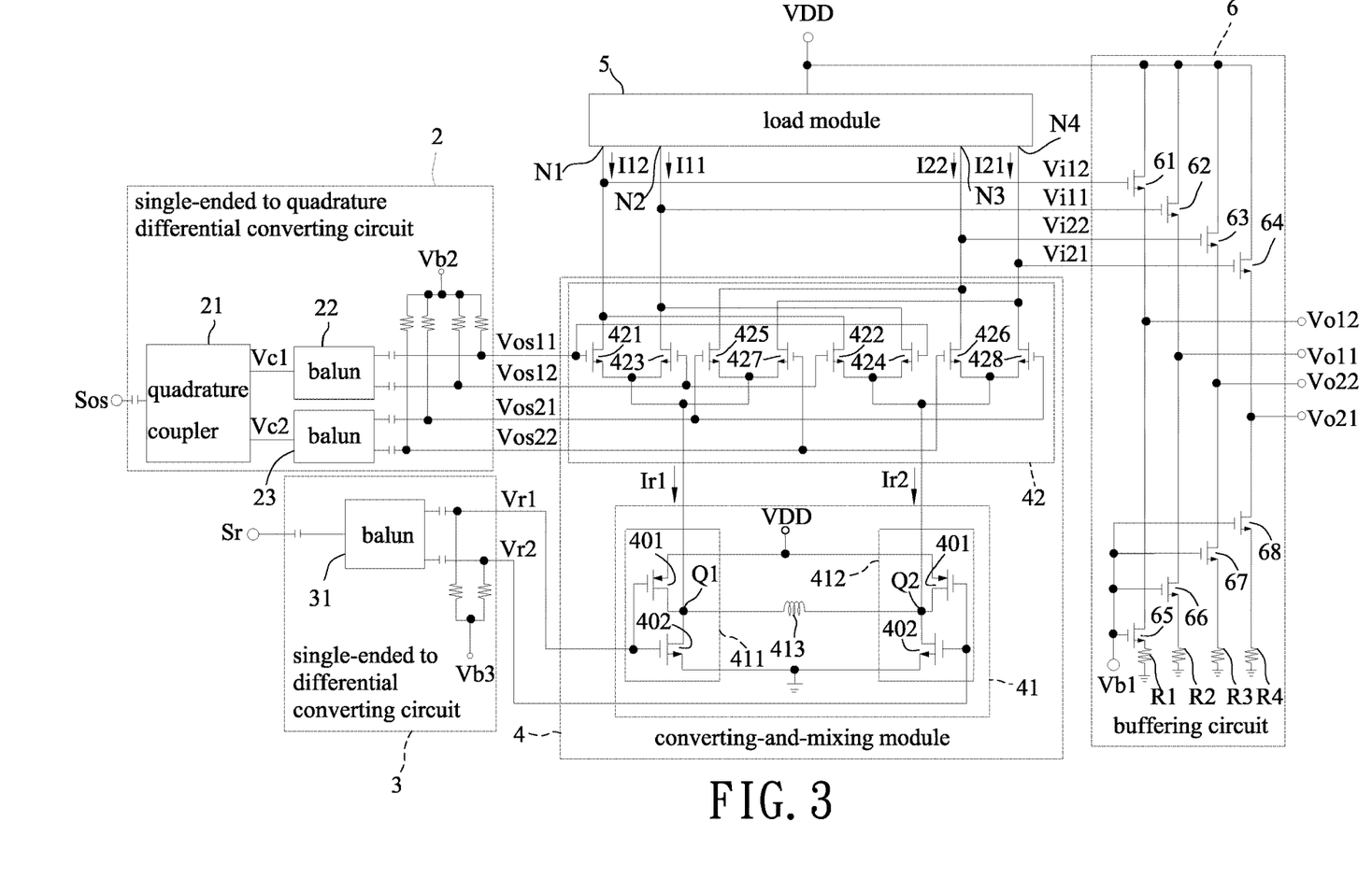

Referring to FIGS. 2 and 3, an embodiment of a down-conversion mixer according to the disclosure includes a single-ended to quadrature differential converting circuit 2, a single-ended to differential converting circuit 3, a converting-and-mixing module 4, a load module 5 and a buffering circuit 6.

The single-ended to quadrature differential converting circuit 2 is for receiving a single-ended oscillatory voltage signal (Sos), and converts the single-ended oscillatory voltage signal (Sos) into a first differential oscillatory voltage signal pair (Vos11, Vos12) and a second differential oscillatory voltage signal pair (Vos21, Vos22) that are offset in phase by 90°. The first differential oscillatory voltage signal pair (Vos11, Vos12) includes a first oscillatory voltage signal (Vos11) and a second oscillatory voltage signal (Vos12). The second differential oscillatory voltage signal pair (Vos21, Vos22) includes a third oscillatory voltage signal (Vos21) and a fourth oscillatory voltage signal (Vos22). In this embodiment, when the first oscillatory voltage signal (Vos11) has a phase of 0°, the third oscillatory voltage signal (Vos21) has a phase of 90°, the second oscillatory voltage signal (Vos12) has a phase of 180°, and the fourth oscillatory voltage signal (Vos22) has a phase of 270°.

The single-ended to differential converting circuit 3 is for receiving a single-ended input voltage signal (Sr) of, for example, radio frequency, and converts the single-ended input voltage signal (Sr) into a differential input voltage signal pair (Vr1, Vr2) that includes a first input voltage signal (Vr1) and a second input voltage signal (Vr2).

The converting-and-mixing module 4 is connected to the single-ended to quadrature differential converting circuit 2 for receiving the first and second differential oscillatory voltage signal pairs ((Vos11, Vos12), (Vos21, Vos22)) therefrom, and is further connected to the single-ended to differential converting circuit 3 for receiving the differential input voltage signal pair (Vr1, Vr2) therefrom. The converting-and-mixing module 4 performs voltage-to-current conversion and mixing with the first and second differential oscillatory voltage signal pairs ((Vos11, Vos12), (Vos21, Vos22)) upon the differential input voltage signal pair (Vr1, Vr2) to generate a first differential mixed current signal pair (I11, I12) and a second differential mixed current signal pair (I21, I22) that are of, for example, intermediate frequency and that are offset in phase by 90°. The first differential mixed current signal pair (I11, I12) includes a first mixed current signal (I11) and a second mixed current signal (I12). The second differential mixed current signal pair (I21, I22) includes a third mixed current signal (I21) and a fourth mixed current signal (I22). In this embodiment, when the first mixed current signal (I11) has a phase of 0°, the third mixed current signal (I21) has a phase of 90°, the second mixed current signal (I12) has a phase of 180°, and the fourth mixed current signal (I22) has a phase of 270°.

The load module 5 has a first terminal (N1) and a second terminal (N2) that are connected to the converting-and-mixing module 4 for cooperatively receiving the first differential mixed current signal pair (I11, I12) therefrom, and a third terminal (N3) and a fourth terminal (N4) that are connected to the converting-and-mixing module 4 for cooperatively receiving the second differential mixed current signal pair (I21, I22) therefrom. The load module 5 converts the first differential mixed current signal pair (I11, I12) into a first differential mixed voltage signal pair (Vi11, Vi12) that is provided at the first and second terminals (N1, N2) thereof, and converts the second differential mixed current signal pair (I21, I22) into a second differential mixed voltage signal pair (Vi21, Vi22) that is provided at the third and fourth terminals (N3, N4) thereof. The first differential mixed voltage signal pair (Vi11, Vi12) includes a first mixed voltage signal (Vi11) and a second mixed voltage signal (Vi12). The second differential mixed voltage signal pair (Vi21, Vi22) includes a third mixed voltage signal (Vi21) and a fourth mixed voltage signal (Vi22).

The buffering circuit 6 is connected to the first to fourth terminals (N1-N4) of the load module 5 for receiving the first and second differential mixed voltage signal pairs ((Vi11, Vi12), (Vi21, Vi22)) therefrom, and buffers the first and second differential mixed voltage signal pairs ((Vi11, Vi12), (Vi21, Vi22)) to respectively generate a first differential output voltage signal pair (Vo11, Vo12) and a second differential output voltage signal pair (Vo21, Vo22). The first differential output voltage signal pair (Vo11, Vo12) includes a first output voltage signal (Vo11) and a second output voltage signal (Vo12). The second differential output voltage signal pair (Vo21, Vo22) includes a third output voltage signal (Vo21) and a fourth output voltage signal (Vo22).

In an example where the single-ended input voltage signal (Sr) has a frequency of 94 GHz, and where the single-ended oscillatory voltage signal (Sos) has a frequency of 93.9 GHz, each of the first and second differential output voltage signal pairs ((Vo11, Vo12), (Vo21, Vo22)) has a frequency of 0.1 GHz.

In this embodiment, as shown in FIG. 3, the single-ended to quadrature differential converting circuit 2 includes a quadrature coupler 21, two baluns 22, 23 (each of which is, for example, a Marchand balun or an elliptical balun) and other elements. The quadrature coupler 21 is for receiving a voltage signal related to the single-ended oscillatory voltage signal (Sos), and generates, based on the received voltage signal, a first coupled signal (Vc1) and a second coupled signal (Vc2) that are offset in phase by 90°. The balun 22 has an input terminal that is connected to the quadrature coupler 21 for receiving the first coupled signal (Vc1) therefrom, a first output terminal that provides a voltage signal related to the first oscillatory voltage signal (Vos11), and a second output terminal that provides a voltage signal related to the second oscillatory voltage signal (Vos12). The balun 23 has an input terminal that is connected to the quadrature coupler 21 for receiving the second coupled signal (Vc2) therefrom, a first output terminal that provides a voltage signal related to the third oscillatory voltage signal (Vos21), and a second output terminal that provides a voltage signal related to the fourth oscillatory voltage signal (Vos22).

In this embodiment, as shown in FIG. 3, the single-ended to differential converting circuit 3 includes a balun 31 (e.g., a Marchand balun or an elliptical balun) and other elements. The balun 31 has an input terminal that is for receiving a voltage signal related to the single-ended input voltage signal (Sr), a first output terminal that provides a voltage signal related to the first input voltage signal (Vr1), and a second output terminal that provides a voltage signal related to the second input voltage signal (Vr2).

In this embodiment, the converting-and-mixing module 4 includes a transconductance circuit 41 and a mixing circuit 42. The transconductance circuit 41 is connected to the single-ended to differential converting circuit 3 for receiving the differential input voltage signal pair (Vr1, Vr2) therefrom, and converts the differential input voltage signal pair (Vr1, Vr2) into a differential input current signal pair (Ir1, Ir2) that includes a first input current signal (Ir1) and a second input current signal (Ir2). The mixing circuit 42 is connected to the single-ended to quadrature differential converting circuit 2 for receiving the first and second differential oscillatory voltage signal pairs ((Vos11, Vos12), (Vos21, Vos22)) therefrom, is further connected to the transconductance circuit 41 for receiving the differential input current signal pair (Ir1, Ir2) therefrom, and is further connected to the first to fourth terminals (N1-N4) of the load module 5. The mixing circuit 42 mixes the differential input current signal pair (Ir1, Ir2) with the first and second differential oscillatory voltage signal pairs ((Vos11, Vos12), (Vos21, Vos22)) to generate the first and second differential mixed current signal pairs ((I11, I12), (I21, I22)) for receipt by the load module 5.

In this embodiment, as shown in FIG. 3, the transconductance circuit 41 includes a first transconductance unit 411, a second transconductance unit 412 and an inductor 413. The first transconductance unit 411 is connected to the single-ended to differential converting circuit 3 for receiving the first input voltage signal (Vr1) therefrom, and converts the first input voltage signal (Vr1) into the first input current signal (Ir1). Likewise, the second transconductance unit 412 is connected to the single-ended to differential converting circuit 3 for receiving the second input voltage signal (Vr2) therefrom, and converts the second input voltage signal (Vr2) into the second input current signal (Ir2). The inductor 413 is connected between the first and second transconductance units 411, 412. In particular, the first input current signal (Ir1) is in-phase with the first input voltage signal (Vr1), the second input current signal (Ir2) is in-phase with the second input voltage signal (Vr2), and each of the first and second transconductance units 411, 412 includes two transistors 401, 402. For each of the first and second transconductance units 411, 412, the transistor 401 has a first terminal that is for receiving a first reference voltage (e.g., a supply voltage (VDD)), a second terminal that is connected to the inductor 413, and a control terminal that is connected to the single-ended to differential converting circuit 3 for receiving a corresponding one of the first and second input voltage signals (Vr1, Vr2) therefrom; the transistor 402 has a first terminal that is connected to the second terminal of the transistor 401, a second terminal that is for receiving a second reference voltage (e.g., a ground voltage), and a control terminal that is connected to the control terminal of the transistor 401; and the transistor 402 cooperates with the transistor 401 to provide a corresponding one of the first and second input current signals (Ir1, Ir2) at a common node (Q1/Q2) of the transistors 401, 402 and the inductor 413.

In this embodiment, as shown in FIG. 3, the mixing circuit 42 includes eight transistors 421-428. The transistor 421 has a first terminal that is connected to the first terminal (N1) of the load module 5, a second terminal that is connected to the common node (Q1), and a control terminal that is connected to the single-ended to quadrature differential converting circuit 2 for receiving the first oscillatory voltage signal (Vos11) therefrom. The transistor 422 has a first terminal that is connected to the first terminal of the transistor 421, a second terminal that is connected to the common node (Q2), and a control terminal that is connected to the single-ended to quadrature differential converting circuit 2 for receiving the second oscillatory voltage signal (Vos12) therefrom. The transistor 422 cooperates with the transistor 421 to provide the second mixed current signal (I12) for receipt by the load module 5. The transistor 423 has a first terminal that is connected to the second terminal (N2) of the load module 5, a second terminal that is connected to the second terminal of the transistor 421, and a control terminal that is connected to the control terminal of the transistor 422. The transistor 424 has a first terminal that is connected to the first terminal of the transistor 423, a second terminal that is connected to the second terminal of the transistor 422, and a control terminal that is connected to the control terminal of the transistor 421. The transistor 424 cooperates with the transistor 423 to provide the first mixed current signal (I11) for receipt by the load module 5. The transistor 425 has a first terminal that is connected to the third terminal (N3) of the load module 5, a second terminal that is connected to the second terminal of the transistor 421, and a control terminal that is connected to the single-ended to quadrature differential converting circuit 2 for receiving the third oscillatory voltage signal (Vos21) therefrom. The transistor 426 has a first terminal that is connected to the first terminal of the transistor 425, a second terminal that is connected to the second terminal of the transistor 422, and a control terminal that is connected to the single-ended to quadrature differential converting circuit 2 for receiving the fourth oscillatory voltage signal (Vos22) therefrom. The transistor 426 cooperates with the transistor 425 to provide the fourth mixed current signal (I22) for receipt by the load module 5. The transistor 427 has a first terminal that is connected to the fourth terminal (N4) of the load module 5, a second terminal that is connected to the second terminal of the transistor 421, and a control terminal that is connected to the control terminal of the transistor 426. The transistor 427 cooperates with the transistors 421, 423, 425 to receive the first input current signal (Ir1) from the first transconductance unit 411. The transistor 428 has a first terminal that is connected to the first terminal of the transistor 427, a second terminal that is connected to the second terminal of the transistor 422, and a control terminal that is connected to the control terminal of the transistor 425. The transistor 428 cooperates with the transistors 422, 424, 426 to receive the second input current signal (Ir2) from the second transconductance unit 412, and cooperates with the transistor 427 to provide the third mixed current signal (I21) for receipt by the load module 5.

In this embodiment, as shown in FIG. 2, the load module 5 receives the first, second, third and fourth mixed current signals (I11, I12, I21, I22) respectively at the second, first, fourth and third terminals (N2, N1, N4, N3) thereof, and provides the first, second, third and fourth mixed voltage signals (Vi11, Vi12, Vi13, Vi14) respectively at the second, first, fourth and third terminals (N2, N1, N4, N3) thereof. In addition, the load module 5 includes a negative resistance providing circuit 51 and two resistor-inductor (RL) circuits 52, 53.

The negative resistance providing circuit 51 is connected to the first to fourth terminals (N1-N4) of the load module 5, and provides two negative resistances, one of which is between the first and second terminals (N1, N2) of the load module 5, and the other one of which is between the third and fourth terminals (N3, N4) of the load module 5. In this embodiment, the negative resistance providing circuit 51 includes two negative resistance cells 511, 512 that respectively provide the negative resistances. Each of the negative resistance cells 511, 512 includes two transistors 501, 502, two capacitors 503, 504 and two resistors 505, 506. For each of the negative resistance cells 511, 512, each of the resistors 505, 506 has a first terminal that is for receiving a control voltage (Vcs), and a second terminal; each of the transistors 501, 502 has a first terminal that is for receiving the first reference voltage (i.e., the supply voltage (VDD)), a second terminal, a control terminal that is connected to the second terminal of a respective one of the resistors 505, 506 for receiving the control voltage (Vcs) through the respective one of the resistors 505, 506, and a transconductance that varies according to the control voltage (Vcs); the capacitor 503 is connected between the control terminal of the transistor 501 and the second terminal of the transistor 502; and the capacitor 504 is connected between the control terminal of the transistor 502 and the second terminal of the transistor 501. The second terminals of the transistors 501, 502 of the negative resistance cell 511 are respectively connected to the first and second terminals (N1, N2) of the load module 5. The second terminals of the transistors 501, 502 of the negative resistance cell 512 are respectively connected to the third and fourth terminals (N3, N4) of the load module 5.

In this embodiment, each of the RL circuits 52, 53 includes two variable resistors 521/531, 523/533 and an inductor 522/532 that are connected in series between a corresponding one of the first and third terminals (N1, N3) of the load module 5 and a corresponding one of the second and fourth terminals (N2, N4) of the load module 5, with the inductor 522/532 connected between the variable resistors 521/531, 523/533.

In this embodiment, as shown in FIG. 3, the buffering circuit 6 includes eight transistors 61-68 and four resistors (R1-R4). Each of the transistors 61-64 has a first terminal that is for receiving the first reference voltage (i.e., the supply voltage (VDD)), a second terminal, and a control terminal. The control terminals of the transistors 61, 62, 63, 64 are respectively connected to the first, second, third and fourth terminals (N1, N2, N3, N4) of the load module 5 for respectively receiving the second, first, fourth and third mixed voltage signals (Vi12, Vi11, Vi22, Vi21) therefrom. Each of the transistors 65-68 has a first terminal that is connected to the second terminal of a respective one of the transistors 61-64, a second terminal, and a control terminal that is for receiving a bias voltage (Vb1). Each of the resistors (R1-R4) has a first terminal that is connected to the second terminal of a respective one of the transistors 65-68, and a second terminal that is for receiving the second reference voltage (i.e., the ground voltage). The first, second, third and fourth output voltage signals (Vo11, Vo12, Vo21, Vo22) are respectively provided at the second terminals of the transistors 62, 61, 64, 63.

In this embodiment, each of the transistors 402, 421-428, 61-68 is an N-type metal oxide semiconductor field effect transistor (nMOSFET) having a drain terminal, a source terminal and a gate terminal that respectively serve as the first, second and control terminals of the transistor; and each of the transistors 401, 501, 502 is a P-type metal oxide semiconductor field effect transistor (pMOSFET) having a source terminal, a drain terminal and a gate terminal that respectively serve as the first, second and control terminals of the transistor.

In this embodiment, when a frequency of each of the first and second differential mixed current signal pairs ((I11, I12), (I21, I22)) is low (e.g., within a range of 0 Hz to 0.1 GHz), a conversion gain (CG) of a combination of the converting-and-mixing module 4 and the load module 5 can be expressed by the following equation:

$$CG \approx \frac{2}{\Pi} \cdot \text{sinc}(\Pi \cdot \Delta / T_{OS}) \cdot (g_{m402} + g_{m401}) \cdot \frac{R_{521,523,531,533}}{1 - g_{m501,502} \cdot R_{521,523,531,533}},$$ Equation 2 where $g_{m402}$ denotes a transconductance of the transistor 402 of each of the first and second transconductance units 411, 412, $g_{m401}$ denotes a transconductance of the transistor 401 of each of the first and second transconductance units 411, 412, $g_{m501,502}$ denotes the transconductance of each of the transistors 501, 502 of the negative resistance cells 511, 512, $R_{521,523,531,533}$ denotes the resistance of each of the variable resistors 521, 523, 531, 533 of the RL circuits 52, 53, $T_{os}$ denotes a period of each of the first and second differential oscillatory voltage signal pairs ((Vos11, Vos12), (Vos21, Vos22)), and Δ denotes a half of the fraction of the period in which all of the transistors 421-428 conduct. In an example, $\Delta/T_{os}$ is 0.0885, and $\text{sinc}(\pi \cdot \Delta/T_{os})$ is 0.987.

In this embodiment, since the resistance ($R_{521,523,531,533}$) of each of the variable resistors 521, 523, 531, 533 is not fixed, one can increase the resistance ($R_{521,523,531,533}$) of each of the variable resistors 521, 523, 531, 533 to increase the conversion gain (CG) of the combination of the converting-and-mixing module 4 and the load module 5, thereby increasing a conversion gain of the down-conversion mixer and reducing a noise figure of the down-conversion mixer. In addition, since the transconductance ($g_{m501, 502}$) of each of the transistors 501, 502 varies according to the control voltage (Vcs), one can decrease the control voltage (Vcs) to increase the transconductance ($g_{m501,502}$) of each of the transistors 501, 502, thereby increasing the conversion gain (CG) of the combination of the converting-and-mixing module 4 and the load module 5, and thus increasing the conversion gain of the down-conversion mixer and reducing the noise figure of the down-conversion mixer. Moreover, the inductor 413 resonates with the parasitic capacitances of the transistors 401, 402, 421-428 to compensate a frequency pole generated due to the parasitic capacitances of the transistors 401, 402, 421-428, thereby increasing the conversion gain (CG) of the combination of the converting-and-mixing module 4 and the load module 5, and thus increasing the conversion gain of the down-conversion mixer and reducing the noise figure of the down-conversion mixer.

Figure 4:
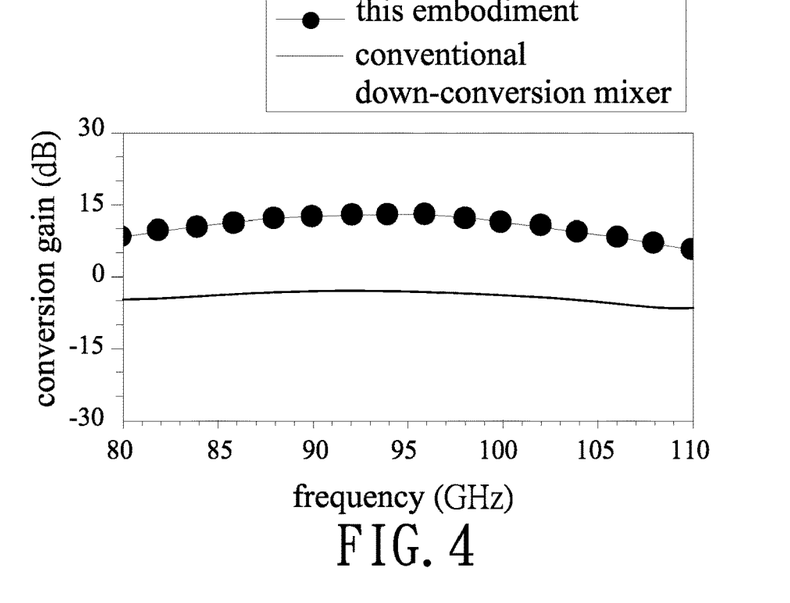
FIG. 4 is a plot illustrating conversion gain versus frequency characteristic for the embodiment and the conventional down-conversion mixer.

FIG. 4 illustrates simulated conversion gain of the down-conversion mixer of this embodiment and simulated conversion gain of the conventional down-conversion mixer under a circumstance where the frequency of the single-ended input voltage signal (Sr) (see FIGS. 1 and 2) is within a range of 80 GHz to 110 GHz, and where the frequency of the single-ended oscillatory voltage signal (Sos) (see FIGS. 1 and 2) is lower than that of the single-ended input voltage signal (Sr) (see FIGS. 1 and 2) by 0.1 GHz. It can be reasonably determined from FIG. 4 that the conversion gain of the down-conversion mixer of this embodiment is higher than that of the conventional down-conversion mixer.

Figure 5:
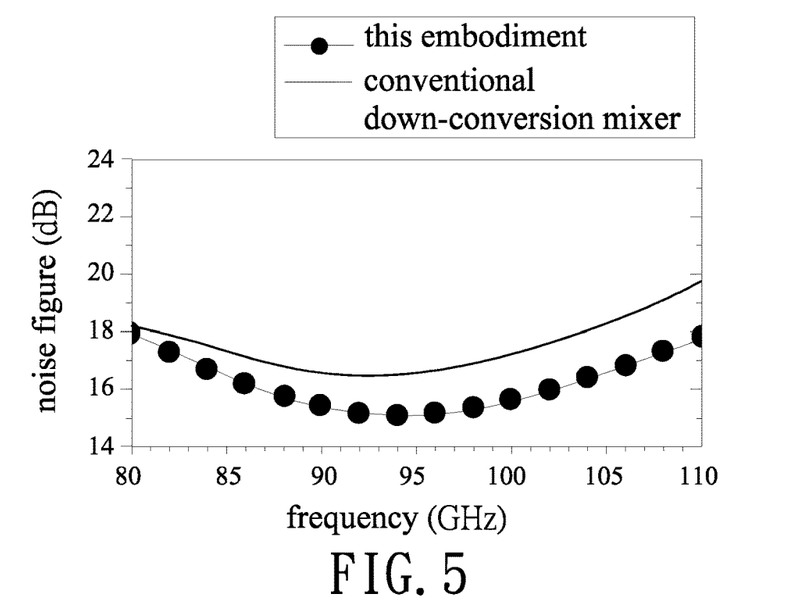
FIG. 5 is a plot illustrating noise figure versus frequency characteristic for the embodiment and the conventional down-conversion mixer.

FIG. 5 illustrates simulated noise figure of the down-conversion mixer of this embodiment and simulated noise figure of the conventional down-conversion mixer under the aforesaid circumstance. It can be reasonably determined from FIG. 5 that the noise figure of the down-conversion mixer of this embodiment is lower than that of the conventional down-conversion mixer.

Referring back to FIGS. 2 and 3, in view of the above, in this embodiment, since the conversion gain and the noise figure of the down-conversion mixer varies according to the resistance of each of the variable resistors 521, 523, 531, 533 and the control voltage (Vcs), one can adjust the resistance of each of the variable resistors 521, 523, 531, 533 and the control voltage (Vcs) to change the conversion gain and the noise figure of the down-conversion mixer.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that the disclosure is not limited to the disclosed embodiment but is intended to cover various arrangements included within the spirit and scope of the broadest interpretation so as to encompass all such modifications and equivalent arrangements.

What is claimed is:

1. A down-conversion mixer comprising:
   a converting-and-mixing module for receiving a differential input voltage signal pair, a first differential oscillatory voltage signal pair and a second differential oscillatory voltage signal pair, and performing voltage-to-current conversion and mixing with the first and second differential oscillatory voltage signal pairs upon the differential input voltage signal pair to generate a first differential mixed current signal pair and a second differential mixed current signal pair; and
   a load module having a first terminal and a second terminal that are connected to said converting-and-mixing module for cooperatively receiving the first differential mixed current signal pair therefrom, and a third terminal and a fourth terminal that are connected to said converting-and-mixing module for cooperatively receiving the second differential mixed current signal pair therefrom, said load module converting the first differential mixed current signal pair into a first differential mixed voltage signal pair that is provided at said first and second terminals thereof, and converting the second differential mixed current signal pair into a second differential mixed voltage signal pair that is provided at said third and fourth terminals thereof, said load module including
      a negative resistance providing circuit connected to said first to fourth terminals of said load module, and providing two negative resistances, one of which is between said first and second terminals of said load module, and the other one of which is between said third and fourth terminals of said load module, and
      two resistor-inductor (RL) circuits, one of which is connected between said first and second terminals of said load module, and the other one of which is connected between said third and fourth terminals of said load module, each of said RL circuits including two variable resistors and a first inductor that are connected in series between a corresponding one of said first and third terminals of said load module and a corresponding one of said second and fourth terminals of said load module, with said first inductor connected between said variable resistors.

2. The down-conversion mixer of claim 1, wherein:
   said negative resistance providing circuit includes two negative resistance cells; and
   each of said negative resistance cells includes
      two resistors, each having a first terminal that is for receiving a control voltage, and a second terminal,
      a first transistor and a second transistor, each having a first terminal that is for receiving a reference voltage, a second terminal, a control terminal that is connected to said second terminal of a respective one of said resistors for receiving the control voltage through the respective one of said resistors, and a transconductance that varies according to the control voltage,
      a first capacitor connected between said control terminal of said first transistor and said second terminal of said second transistor, and
      a second capacitor connected between said control terminal of said second transistor and said second terminal of said first transistor;
   said second terminals of said first and second transistors of one of said negative resistance cells are respectively connected to said first and second terminals of said load module; and
   said second terminals of said first and second transistors of the other one of said negative resistance cells are respectively connected to said third and fourth terminals of said load module.

3. The down-conversion mixer of claim 1, wherein said converting-and-mixing module includes:
   a transconductance circuit for receiving the differential input voltage signal pair, and converting the differential input voltage signal pair into a differential input current signal pair; and
   a mixing circuit for receiving the first and second differential oscillatory voltage signal pairs, connected to said transconductance circuit for receiving the differential input current signal pair therefrom, and further connected to said first to fourth terminals of said load module, said mixing circuit mixing the differential input current signal pair with the first and second differential oscillatory voltage signal pairs to generate the first and second differential mixed current signal pairs for receipt by said load module.

4. The down-conversion mixer of claim 3, wherein:
   the differential input voltage signal pair includes a first input voltage signal and a second input voltage signal;
   the differential input current signal pair includes a first input current signal and a second input current signal;
   said transconductance circuit includes
      a first transconductance unit for receiving the first input voltage signal, and converting the first input voltage signal into the first input current signal,
      a second transconductance unit for receiving the second input voltage signal, and converting the second input voltage signal into the second input current signal, and
      a second inductor connected between said first and second transconductance units; and
   said mixing circuit is connected to a common node of said first transconductance unit and said second inductor and to a common node of said second transconductance unit and said second inductor for receiving the differential input current signal pair therefrom.

5. The down-conversion mixer of claim 4, wherein:
   the first input current signal is in-phase with the first input voltage signal, and the second input current signal is in-phase with the second input voltage signal; and each of said first and second transconductance units includes:
  a first transistor having a first terminal that is for receiving a first reference voltage, a second terminal that is connected to said inductor and said mixing circuit, and a control terminal that is for receiving a corresponding one of the first and second input voltage signals; and
  a second transistor having a first terminal that is connected to said second terminal of said first transistor, a second terminal that is for receiving a second reference voltage, and a control terminal that is connected to said control terminal of said first transistor, said second transistor cooperating with said first transistor to provide a corresponding one of the first and second input current signals for receipt by said mixing circuit.

6. The down-conversion mixer of claim 3, wherein:
the first differential oscillatory voltage signal pair includes a first oscillatory voltage signal and a second oscillatory voltage signal;
the second differential oscillatory voltage signal pair includes a third oscillatory voltage signal and a fourth oscillatory voltage signal;
the differential input current signal pair includes a first input current signal and a second input current signal;
the first differential mixed current signal pair includes a first mixed current signal and a second mixed current signal;
the second differential mixed current signal pair includes a third mixed current signal and a fourth mixed current signal; and
said mixing circuit includes
  a first transistor having a first terminal that is connected to said first terminal of said load module, a second terminal that is connected to said transconductance circuit, and a control terminal that is for receiving the first oscillatory voltage signal,
  a second transistor having a first terminal that is connected to said first terminal of said first transistor, a second terminal that is connected to said transconductance circuit, and a control terminal that is for receiving the second oscillatory voltage signal, said second transistor cooperating with said first transistor to provide the second mixed current signal for receipt by said load module,
  a third transistor having a first terminal that is connected to said second terminal of said load module, a second terminal that is connected to said second terminal of said first transistor, and a control terminal that is connected to said control terminal of said second transistor,
  a fourth transistor having a first terminal that is connected to said first terminal of said third transistor, a second terminal that is connected to said second terminal of said second transistor, and a control terminal that is connected to said control terminal of said first transistor, said fourth transistor cooperating with said third transistor to provide the first mixed current signal for receipt by said load module,
  a fifth transistor having a first terminal that is connected to said third terminal of said load module, a second terminal that is connected to said second terminal of said first transistor, and a control terminal that is for receiving the third oscillatory voltage signal,
  a sixth transistor having a first terminal that is connected to said first terminal of said fifth transistor, a second terminal that is connected to said second terminal of said second transistor, and a control terminal that is for receiving the fourth oscillatory voltage signal, said sixth transistor cooperating with said fifth transistor to provide the fourth mixed current signal for receipt by said load module,
  a seventh transistor having a first terminal that is connected to said fourth terminal of said load module, a second terminal that is connected to said second terminal of said first transistor, and a control terminal that is connected to said control terminal of said sixth transistor, said seventh transistor cooperating with said first, third and fifth transistors to receive the first input current signal from said transconductance circuit, and
  an eighth transistor having a first terminal that is connected to said first terminal of said seventh transistor, a second terminal that is connected to said second terminal of said second transistor, and a control terminal that is connected to said control terminal of said fifth transistor, said eighth transistor cooperating with said second, fourth and sixth transistors to receive the second input current signal from said transconductance circuit, and cooperating with said seventh transistor to provide the third mixed current signal for receipt by said load module.

7. The down-conversion mixer of claim 1, wherein the first and second differential oscillatory voltage signal pairs are offset in phase by ninety degrees.

8. The down-conversion mixer of claim 1, further comprising a buffering circuit that is connected to said first to fourth terminals of said load module for receiving the first and second differential mixed voltage signal pairs therefrom, and that buffers the first and second differential mixed voltage signal pairs to respectively generate a first differential output voltage signal pair and a second differential output voltage signal pair.

9. The down-conversion mixer of claim 8, wherein:
the first differential mixed voltage signal pair includes a first mixed voltage signal and a second mixed voltage signal;
the second differential mixed voltage signal pair includes a third mixed voltage signal and a fourth mixed voltage signal;
the first differential output voltage signal pair includes a first output voltage signal and a second output voltage signal;
the second differential output voltage signal pair includes a third output voltage signal and a fourth output voltage signal; and
said buffering circuit includes
  four first transistors, each having a first terminal that is for receiving a first reference voltage, a second terminal, and a control terminal that is connected to a respective one of said first to fourth terminals of said load module for receiving a respective one of the first to fourth mixed voltage signals therefrom,
  four second transistors, each having a first terminal that is connected to said second terminal of a respective one of said first transistors, a second terminal, and a control terminal that is for receiving a bias voltage, and
  four resistors, each having a first terminal that is connected to said second terminal of a respective one of said second transistors, and a second terminal that is for receiving a second reference voltage, each of the first to fourth output voltage signals being provided at said second terminal of a respective one of said first transistors.

10. The down-conversion mixer of claim 1, further comprising a single-ended to quadrature differential converting circuit that is connected to said converting-and-mixing module, that is for receiving a single-ended oscillatory voltage signal, and that converts the single-ended oscillatory voltage signal into the first and second differential oscillatory voltage signal pairs for receipt by said converting-and-mixing module.

11. The down-conversion mixer of claim 1, further comprising a single-ended to differential converting circuit that is connected to said converting-and-mixing module, that is for receiving a single-ended input voltage signal, and that converts the single-ended input voltage signal into the differential input voltage signal pair for receipt by said converting-and-mixing module.

\* \* \* \* \*